(12) United States Patent
Li et al.

(10) Patent No.: US 11,313,038 B2
(45) Date of Patent: Apr. 26, 2022

(54) FABRICATING METHOD OF SEMI-POLAR GALLIUM NITRIDE

(71) Applicant: Wafer Works Corporation, Taoyuan (TW)

(72) Inventors: Wen-Chung Li, Taoyuan (TW); Ping-Hai Chiao, Taoyuan (TW)

(73) Assignee: Wafer Works Corporation, Taoyuan (TW)

( * ) Notice: Subject to any disclaimer, the term of this patent is extended or adjusted under 35 U.S.C. 154(b) by 0 days.

(21) Appl. No.: 17/233,572

(22) Filed: Apr. 19, 2021

(65) Prior Publication Data
US 2022/0056580 A1 Feb. 24, 2022

(30) Foreign Application Priority Data
Aug. 18, 2020 (TW) .................. 109128093

(51) Int. Cl.
*C23C 16/34* (2006.01)
*C23C 16/02* (2006.01)

(52) U.S. Cl.
CPC .......... *C23C 16/34* (2013.01); *C23C 16/0236* (2013.01); *C23C 16/0272* (2013.01)

(58) Field of Classification Search
CPC .. C23C 16/34; C23C 16/0236; C23C 16/0272
See application file for complete search history.

(56) References Cited

U.S. PATENT DOCUMENTS

| | | | |
|---|---|---|---|
| 6,417,107 B1 | 7/2002 | Sekimura | |
| 7,129,163 B2 | 10/2006 | Sherrer | |
| 7,704,331 B2* | 4/2010 | Baker | H01L 21/0254 438/479 |
| 7,816,238 B2* | 10/2010 | Osada | C30B 25/02 438/945 |
| 8,992,684 B1* | 3/2015 | Kovalenkov | C30B 35/00 427/255.394 |
| 9,117,760 B2 | 8/2015 | Hsu | |

(Continued)

FOREIGN PATENT DOCUMENTS

KR 10-1166435 7/2012

OTHER PUBLICATIONS

Baker, Troy J., et al., "Characterization of Planar Semipolar Gallium Nitride Films on Sapphire Substrates". Japanese Journal of Applied Physics, vol. 45, No. 6, 2006, pp. L154-L157.*

(Continued)

*Primary Examiner* — Bret P Chen
(74) *Attorney, Agent, or Firm* — Winston Hsu

(57) ABSTRACT

A method of fabricating semi-polar gallium nitride includes providing a silicon-on-insulator (SOI) substrate. The SOI substrate includes a substrate, a silicon oxide layer and a silicon substrate. The silicon substrate has (1,0,0) facets. The silicon oxide layer is disposed between the substrate and the silicon substrate. Later, a vapor etching process is performed to etch the (1,0,0) facets to form (1,1,1) facets. The vapor etching process is performed by disposing a nebulizer under the SOI substrate. The top surface of the silicon substrate faces the nebulizer. Later, the nebulizer turns etchant into mist to etch the (1,0,0) facets by the mist to form (1,1,1) facets. Finally, an epitaxial process is performed to grow a semi-polar gallium nitride layer on the (1,1,1) facets.

13 Claims, 5 Drawing Sheets

(56) References Cited

U.S. PATENT DOCUMENTS

| | | | |
|---|---|---|---|
| 11,158,760 B2* | 10/2021 | Alhassan | H01L 33/40 |
| 2015/0123140 A1* | 5/2015 | Kim | C30B 29/403 |
| | | | 438/478 |
| 2021/0183652 A1* | 6/2021 | Chiao | H01L 21/02639 |

OTHER PUBLICATIONS

Bessolov, V.N., et al., "Properties of Semipolar GaN Grown on a Si(100) Substrate". Semiconductors, 2019, vol. 53, No. 7, pp. 989-992.*

Ding, K., et al., "Recent progress in nonpolar and semi-polar GaN light emitters on patterned Si substrates". Proc. SPIE 10532, Gallium Nitride Materials and Devices XIII, 1053208 (Feb. 23, 2018) pp. 1-16.*

Bessolov, V.N., et al., "Semipolar Gallium Nitride on Silicon: Technology and Properties". Rev.Adv. Mater. Sci. 38 (2014) 75-93.*

Wang, T., "Topical Review: Development of overgrown semi-polar GaN for high efficiency green/ yellow emission". Semicond. Sci. Technol. 31 (2016) 093003, pp. 1-26.*

Bessolov, "Semipolar GaN Layers Grown on Nanostructured Si (100) Substrate", Technical Physics Letters vol. 44, pp. 525-527(2018).

* cited by examiner

FABRICATING METHOD OF SEMI-POLAR GALLIUM NITRIDE

BACKGROUND OF THE INVENTION

1. Field of the Invention

The present invention relates to a method of fabricating gallium nitride, and more particularly to a method of forming gallium nitride on (1,1,1) facets of a silicon substrate which is made from etching (1,0,0) facets of the silicon substrate, and the method of forming gallium nitride is by an epitaxial process.

2. Description of the Prior Art

III-V semiconductors have excellent photoelectric conversion characteristics and are fast in electronic transmission; therefore they play a very important role in lighting, optoelectronics, communications, and solar cells. Because of wide energy band gaps, III-V semiconductors can provide a higher breakdown voltage. The wide energy band gaps also make III-V semiconductors suitable for manufacturing optoelectronic devices such as light emitting diodes emitting light within a green light range and a blue light range.

Like silicon, gallium nitride can grow into a crystalline material with a high purity. However, the growth of gallium nitride is more difficult and more expensive than silicon. Generally speaking, the semiconductor devices and the optoelectronic devices utilize polar gallium nitride grown along a C-plane direction of a hexagonal crystal system because C-plane has the lowest surface free energy, and atoms can accumulate along the C-plane direction easily. Therefore, except for some special processes, C-plane is generally a preferred direction.

However, since non-polar and semi-polar gallium nitride does not have built-in electric field in the growth direction, the luminous efficiency is higher than that of polar gallium nitride. In this way, non-polar and semi-polar gallium nitride has great potential in making high efficiency light emitting devices. In addition, because non-polar and semi-polar gallium nitride has strong polarization characteristics, they have various applications in the electronic devices.

SUMMARY OF THE INVENTION

According to a preferred embodiment of the present invention, a method of fabricating a semi-polar gallium nitride layer includes providing a silicon-on-insulator (SOI) substrate, wherein the SOI substrate includes a substrate, a silicon oxide layer and a silicon substrate, the silicon substrate has (1,0,0) facets, and the silicon oxide layer is disposed between the substrate and the silicon substrate. Next, a vapor etching process is performed to etch (1,0,0) facets into (1,1,1) facets. The vapor etching process includes putting the SOI substrate on a heating plate, and the substrate contacting the heating plate. After that, a nebulizer is provided under the heating plate, and a top surface of the silicon substrate faces the nebulizer. Subsequently, the nebulizer is utilized to turn an etchant within the nebulizer into mist and (1,0,0) facets are etched into (1,1,1) facets by the mist. Finally, an epitaxial process is performed to grow the semi-polar gallium nitride layer on (1,1,1) facets.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 depict a method of fabricating a semi-polar gallium nitride layer according to a preferred embodiment of the present invention, wherein:
FIG. 2 is a fabricating stage following FIG. 1;
FIG. 3 is a fabricating stage following FIG. 2;
FIG. 4 is a fabricating stage following FIG. 3;
and
FIG. 5 is a fabricating stage following FIG. 4.

DETAILED DESCRIPTION

FIG. 1 to FIG. 5 depict a method of fabricating a semi-polar gallium nitride layer according to a preferred embodiment of the present invention.

Figure 1:
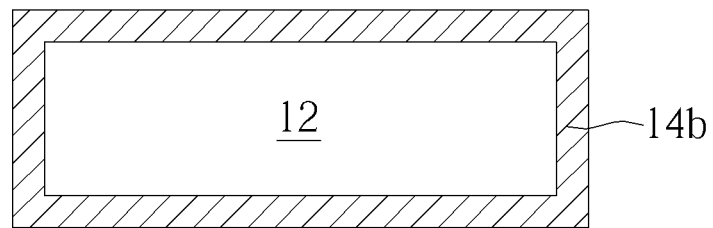
Figure 1:
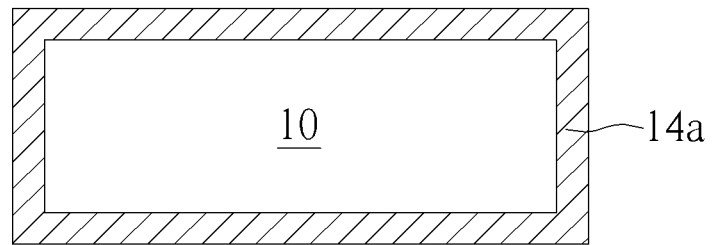

As shown in FIG. 1, a substrate 10 and a silicon substrate 12 are provided. The silicon substrate 12 preferably includes (1,0,0) facets. The substrate 10 is preferably a silicon substrate, and the facet orientation of the substrate 10 is not limited. Next, a high temperature oxidation process is performed to oxidize the surface of the substrate 10 and the surface of the silicon substrate 12 to form a first oxide layer 14a encapsulating the substrate 10 and a second oxide layer 14b encapsulating the silicon substrate 10. The first oxide layer 14a and the second oxide layer 14b are preferably silicon oxide.

Figure 2:
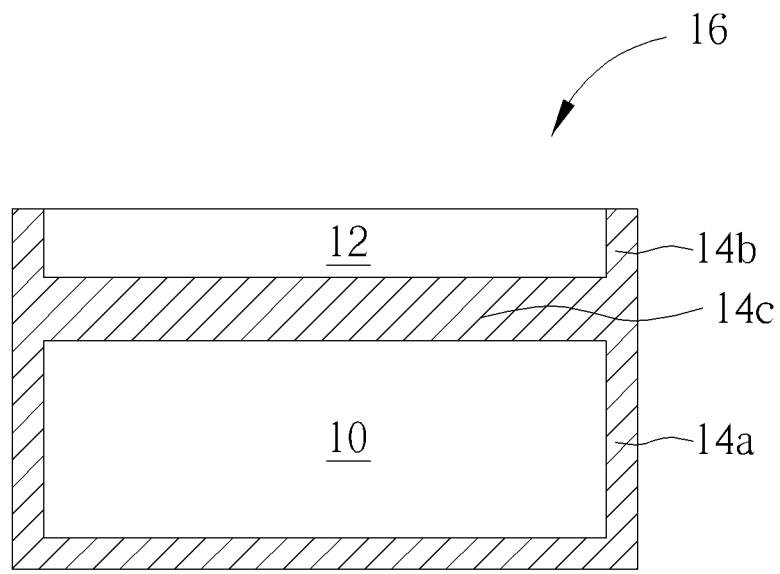

As shown in FIG. 2, a bonding process is performed to bond the first oxide layer 14a to the second oxide layer 14b. The first oxide layer 14a and the second oxide layer 14b are heated to form bonds between each other and merge into an oxide layer 14c.

Later, a planarization process is performed to thin the silicon substrate 12 and remove the second oxide layer 14b on the top surface of the silicon substrate 12. After the planarization process, (1,0,0) facets of the silicon substrate 12 are exposed. Now, the substrate 10, the silicon substrate 12 and the oxide layer 14c together form a silicon on insulator (SOI) substrate 16. The oxide layer 14c is disposed between the substrate 10 and the silicon substrate 12. The first oxide layer 14a encapsulates the substrate 10 and the second oxide layer 14b covers two sidewalls and a bottom of the silicon substrate 12.

Figure 3:
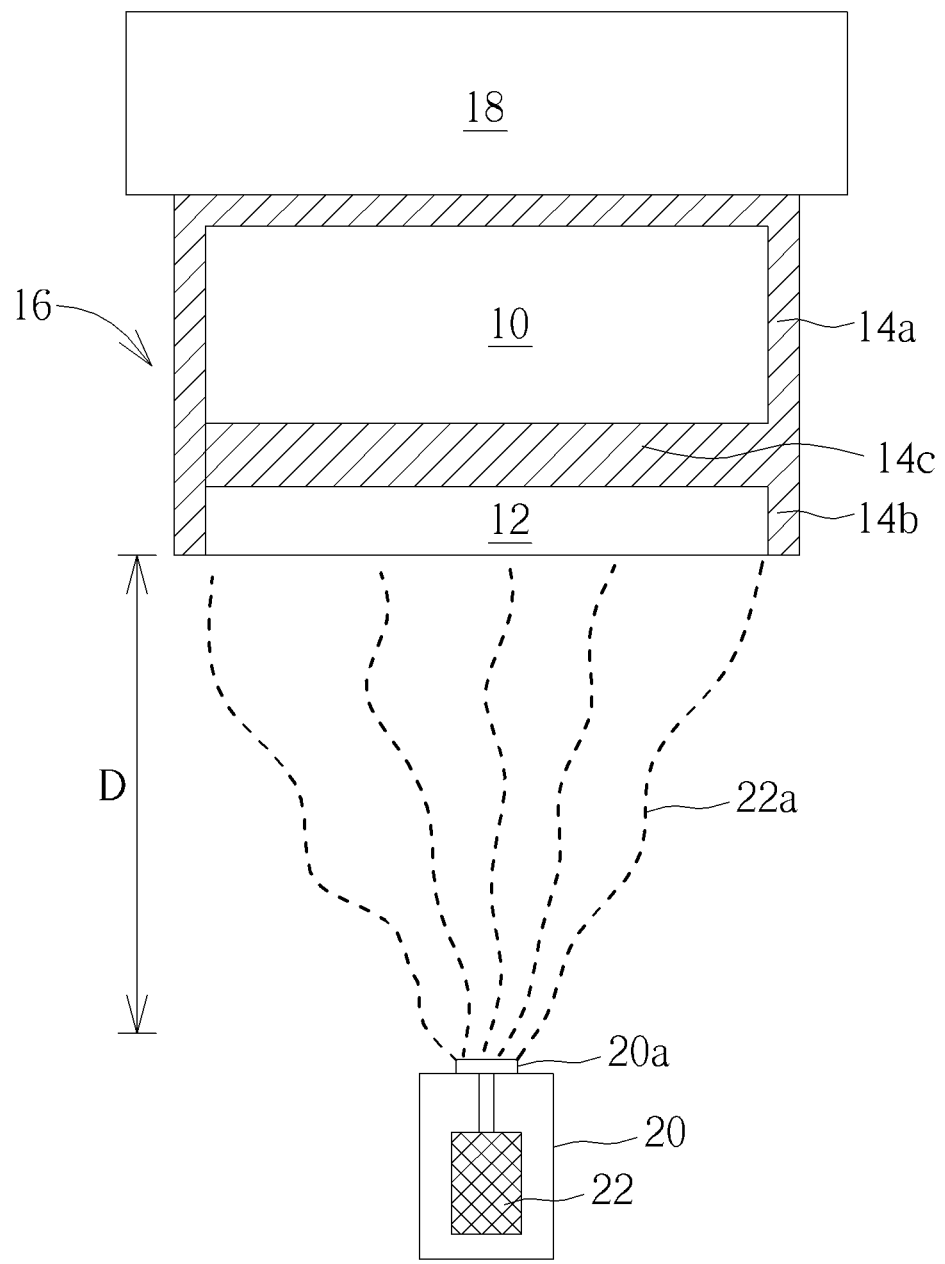
Figure 4:
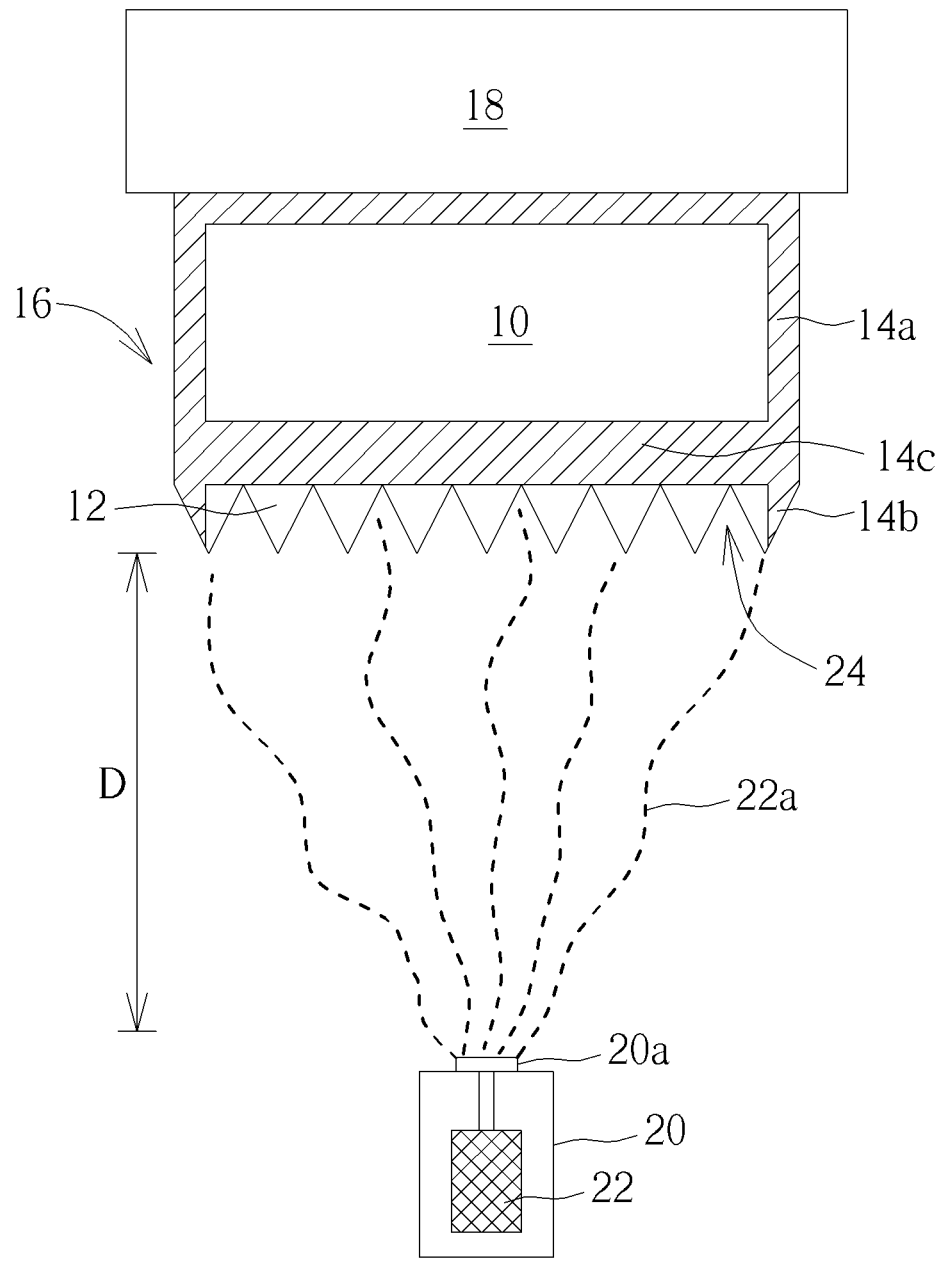
Figure 7:
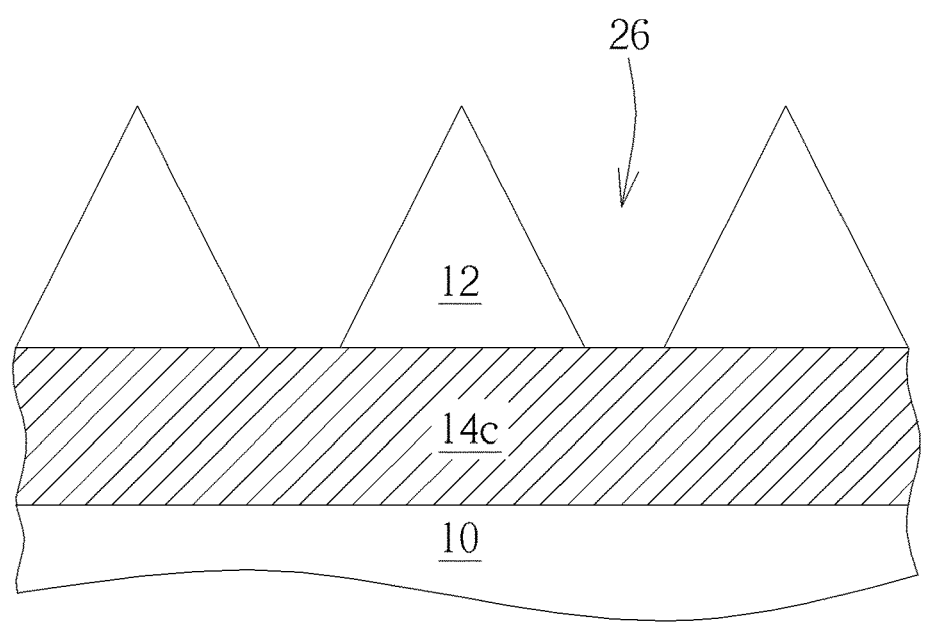
FIG. 7 depicts (1,1,1) facets on a silicon substrate according to another preferred embodiment of the present invention.

As shown in FIG. 3 and FIG. 4, a vapor etching process is performed. The vapor etching process includes disposing the SOI substrate 16 on a heating plate 18. The substrate 10 contacts the heating plate 18. A nebulizer 20 is disposed under the heating plate 18, and the substrate 10 contacts the heating plate 18. A top surface of the silicon substrate 12 faces the nebulizer 20. Next, the nebulizer 20 turns an etchant 22 within the nebulizer 20 into mist 22a. The mist 22a sprayed from the nebulizer 20 then contacts (1,0,0) facets of the silicon substrate 12, and (1,0,0) facets are etched into (1,1,1) facets by the mist 22a. After the vapor etching process, numerous V-shaped trenches 24 are formed on the silicon substrate 12, and (1,1,1) facets serve as the sidewalls of the V-shaped trenches 24. FIG. 7 depicts (1,1,1) facets on a silicon substrate according to another preferred embodiment of the present invention. As shown in FIG. 7, after the vapor etching process, (1,1,1) facets and the oxide layer 14c can form numerous trapezoid-shaped trenches 26 by adjusting concentration of the etchant to change the etching rate. That is, (1,1,1) facets serve as the sidewalls of the trapezoid-shaped trenches 26 and the oxide layer 14c serve as the bottoms of the trapezoid-shaped trenches 26.

According to a preferred embodiment of the present invention, the etchant 22 includes potassium hydroxide (KOH) aqueous solution, tetramethyl ammonium hydroxide (TMAH) aqueous solution, sodium hydroxide (NaOH) aqueous solution or ethylenediamine pyrocatechol (EDP) aqueous solution, but not limited to these solutions. Other etchants which can etch silicon can be used as the etchant 22 in the present invention. Furthermore, a concentration of the etchant 22 is between 30 and 60 wt %. For example, the etchant 22 may be NaOH aqueous solution with a concentration of 30 wt %. However, the concentration of the etchant 22 can exceed the range of 30 and 60 wt % based on different product requirements.

The nebulizer 20 includes a pneumatic jet nebulizer, an ultrasonic nebulizer or a mesh nebulizer. Pneumatic jet nebulizer is based on Bernoulli's principle, and pneumatic jet nebulizer uses the negative pressure generated by compressing air to pass through a nozzle of a small tube to convert the etchant in the nebulizer into mist. The ultrasonic nebulizer uses an electronic oscillator to generate high-frequency ultrasonic waves to convert the etchant into mist. The mesh nebulizer uses a micro pump to drive the etchant through the nozzle to make the etchant become finer mist.

Moreover, the silicon oxide layer 14c serves as an etching stop layer during the vapor etching process. In other words, when the etchant 22 contacting the oxide layer 14c, the vapor etching process stops spontaneously. Therefore, an over etching problem can be prevented in the present invention. In addition, based on the physical property of silicon, (1,1,1) facets will not be etched during the vapor etching process; therefore (1,1,1) facets can be formed on the silicon substrate 12 by the vapor etching process without using a lithographic process to pattern the silicon substrate 12. In this way, the method of the present invention can reduce several fabricating steps.

Moreover, the SOI substrate 16 can be heated by the heating plate 18 during the vapor etching process to make the temperature of the silicon substrate 12 between 40 and 120° C. According to a preferred embodiment of the present invention, the temperature of the silicon substrate 12 is 80° C. When the temperature of the silicon substrate 12 is higher than the room temperature, the etching rate can be increased. A distance D is between the top surface of the silicon substrate 12 and the nozzle 20a of the nebulizer 20 where the mist 22a is sprayed from. The distance D is preferably between 3 and 30 centimeters. According to a preferred embodiment of the present invention, the distance D is 10 centimeters.

Because the etchant 22 is turned into the mist 22a by the nebulizer 20 rather than by heat, the etchant 22 can be maintained in a room temperature. In this way, the concentration of the etchant 22 will not be altered because of the heat. Moreover, the size of the mist 22a can be controlled within a certain range by using the nebulizer 20; therefore, the mist 22a can be spread uniformly on the surface of the silicon substrate 12 to make the location of (1,1,1) facets more even. On the other hand, if the etchant 22 is heated to form the mist 22a, the mist 22a may merge into large drops when the heating temperature is high, and large drops may not distribute evenly on the silicon substrate 12. As a result, (1,1,1) facets will not be located on the silicon substrate 12 uniformly. Furthermore, because the first oxide layer 14a encapsulates the substrate 10, and the second oxide layer 14b covers two sides of the silicon substrate 12, the substrate 10 is not etched and only (1,0,0) facets of the silicon substrate 12 are etched during the vapor etching process.

Figure 5:
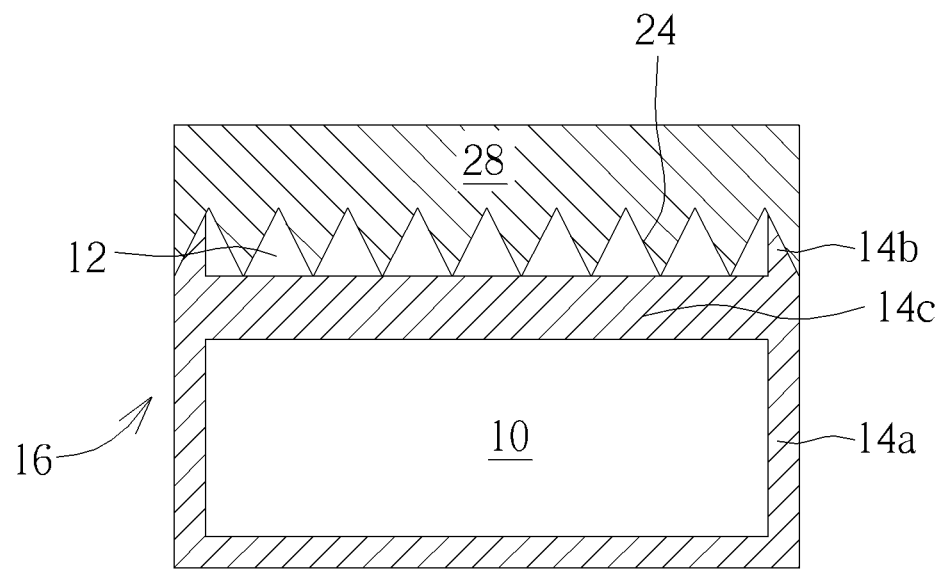
Figure 6:
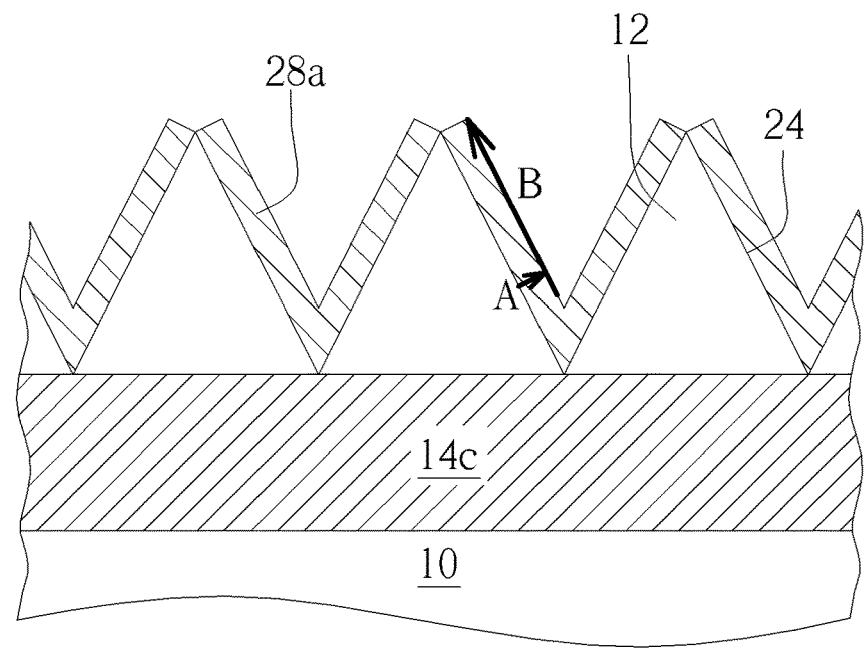
FIG. 6 depicts a growing process of a gallium nitride layer during an epitaxial process.

FIG. 5 is in continuous from FIG. 4. As shown in FIG. 5, the SOI substrate 16 is removed from the heating plate 18. Later, an epitaxial process is performed to grow a semi-polar gallium nitride layer 28 on (1,1,1) facets. The semi-polar gallium nitride layer 28 includes (1, 1, −2, 3) facets, (1, 1, −2, 2) facets, (1, 1, −2, 1) facets, (1, 0, −1, 2) facets, (1, 0, −1, 1) facets or (2, 0, −2, 1) facets. FIG. 6 depicts a growing process of a gallium nitride layer during an epitaxial process. In order to show the growing process clearly, only part of the SOI substrate 16 and part of the V-shaped trenches are shown in FIG. 6. Please refer to FIG. 6. During the epitaxial process, the gallium nitride grows along a direction A which is a direction of c-plane of a hexagonal crystal system to form a polar gallium nitride layer 28a. The direction A is perpendicular to (1,1,1) facets. When the polar gallium nitride layer 28a on two sidewalls of the V-shaped trenches 24 contacts each other, the gallium nitride changes the direction A to a direction B. The direction B includes a direction along (1, 1, −2, 3) facets, (1, 1, −2, 2) facets, (1, 1, −2, 1) facets, (1, 0, −1, 2) facets, (1, 0, −1, 1) facets or (2, 0, −2, 1) facets. The gallium nitride grows along the direction B forms a semi-polar gallium nitride layer 28. Furthermore, the gallium nitride grows continuously to fill up each of the V-shaped trenches 24. After the gallium nitride protrudes from the V-shaped trenches 24, the gallium nitride still grows continuously until the gallium nitride from different V-shaped trenches 24 connects to each other to form a continuous semi-polar gallium nitride layer.

The epitaxial process includes molecular beam epitaxy (MBE), metalorganic chemical vapor deposition (MOCVD) or hydride vapor phase epitaxy (HVPE). For example, the epitaxial process can be an MOCVD performed in a chamber with ammonia and trimethylgallium (TMGa) flow in. Moreover, the MOCVD is performed under a temperature between 900 and 1200° C. to form the semi-polar gallium nitride layer 28. Based on different product requirements, the flow rate of TMGa and the flow rate of ammonia can be adjusted, and the temperature of MOCVD can also be altered to control the facet orientation of the semi-polar gallium nitride layer 28. After forming the semi-polar gallium nitride layer 28, a chemical vapor polishing process can be performed to the semi-polar gallium nitride layer 28, and another epitaxial process can be performed to form another semi-polar gallium nitride layer with a smoother and flatter surface.

Comparing to a process of growing a semi-polar gallium nitride layer on a sapphire substrate or on a silicon substrate originally having (1,1,1) facets, the silicon substrate with (1,0,0) facets used in the present invention is easier to achieve and costs less. Furthermore, the sapphire substrate needs an extra mask and a lithographic process to form facets which is suitable for growing the semi-polar gallium nitride layer. On the other hand, the silicon substrate of the present invention combined with the vapor etching process does not needs any mask; therefore the present invention can provide a simpler fabricating process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semi-polar gallium nitride layer, comprising:
providing a silicon-on-insulator (SOI) substrate, wherein the SOI substrate comprises a substrate, a silicon oxide layer and a silicon substrate, the silicon substrate has (1,0,0) facets, and the silicon oxide layer is disposed between the substrate and the silicon substrate;
performing a vapor etching process to etch (1,0,0) facets into (1,1,1) facets, wherein the vapor etching process comprises:
disposing the SOI substrate on a heating plate, and the substrate contacting the heating plate;
providing a nebulizer under the heating plate, and a top surface of the silicon substrate facing the nebulizer; and
utilizing the nebulizer to turn an etchant within the nebulizer into mist and etching (1,0,0) facets into (1,1,1) facets by the mist; and
performing an epitaxial process to grow the semi-polar gallium nitride layer on (1,1,1) facets.

2. The method of fabricating the semi-polar gallium nitride layer of claim 1, wherein the heating plate heats the silicon substrate to keep a temperature of the silicon substrate between 40 and 120° C.

3. The method of fabricating the semi-polar gallium nitride layer of claim 1, wherein the etchant comprises potassium hydroxide (KOH) aqueous solution, tetramethyl ammonium hydroxide (TMAH) aqueous solution, sodium hydroxide (NaOH) aqueous solution or ethylenediamine pyrocatechol (EDP) aqueous solution.

4. The method of fabricating the semi-polar gallium nitride layer of claim 1, wherein a concentration of the etchant is between 30 and 60 wt %.

5. The method of fabricating the semi-polar gallium nitride layer of claim 1, wherein facets of the semi-polar gallium nitride layer comprises (1, 1, −2, 3) facets, (1, 1, −2, 2) facets, (1, 1, −2, 1) facets, (1, 0, −1, 2) facets, (1, 0, −1, 1) facets or (2, 0, −2, 1) facets of a hexagonal crystal system.

6. The method of fabricating the semi-polar gallium nitride layer of claim 1, wherein during the epitaxial process, a polar gallium nitride layer grows in a direction perpendicular to (1,1,1) facets, then the semi-polar gallium nitride layer grows along a direction of (1, 1, −2, 3) facets, (1, 1, −2, 2) facets, (1, 1, −2, 1) facets, (1, 0, −1, 2) facets, (1, 0, −1, 1) facets or (2, 0, −2, 1) facets of a hexagonal crystal system.

7. The method of fabricating the semi-polar gallium nitride layer of claim 1, wherein after the vapor etching process, the silicon substrate comprises a plurality of V-shaped trenches, the (1,1,1) facets are sidewalls of each of the plurality of V-shaped trenches.

8. The method of fabricating the semi-polar gallium nitride layer of claim 7, wherein a plurality of the semi-polar gallium nitride layers are respectively formed within each of the plurality of V-shaped trenches and protruded from each of the plurality of V-shaped trenches, and the plurality of the semi-polar gallium nitride layers connect to each other.

9. The method of fabricating the semi-polar gallium nitride layer of claim 1, wherein during the vapor etching process, the silicon oxide layer serves as an etching stop layer.

10. The method of fabricating the semi-polar gallium nitride layer of claim 1, wherein during the vapor etching process, the etchant is in a room temperature.

11. The method of fabricating the semi-polar gallium nitride layer of claim 1, further comprising encapsulating the substrate by a first silicon oxide layer and covering two sidewalls and a bottom of the silicon substrate by a second silicon oxide layer.

12. The method of fabricating the semi-polar gallium nitride layer of claim 1, wherein during the vapor etching process, a distance between the top surface of the silicon substrate and a nozzle of the nebulizer is between 3 and 30 centimeters.

13. The method of fabricating the semi-polar gallium nitride layer of claim 1, wherein the nebulizer comprises a pneumatic jet nebulizer, an ultrasonic nebulizer or a mesh nebulizer.

* * * * *